(12) United States Patent
Chung

(10) Patent No.: US 6,614,068 B1
(45) Date of Patent: Sep. 2, 2003

(54) SOI DEVICE WITH REVERSED STACKED CAPACITOR CELL AND BODY CONTACT STRUCTURE AND METHOD FOR FABRICATING THE SAME

(75) Inventor: Myung Jun Chung, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/427,563

(22) Filed: Oct. 26, 1999

(30) Foreign Application Priority Data

Oct. 28, 1998 (KR) ............................................ 98-45583

(51) Int. Cl.$^7$ .......................................... H01L 27/108
(52) U.S. Cl. ...................... 257/306; 257/347; 257/296
(58) Field of Search ................................ 257/621, 303, 257/68, 347, 306, 330, 329, 623, 301, 296

(56) References Cited

U.S. PATENT DOCUMENTS

| 5,145,801 A | * | 9/1992 | Chhabra |
| 5,498,562 A | * | 3/1996 | Dennison et al. |
| 5,592,009 A | | 1/1997 | Hidaka ........................ 257/351 |
| 5,776,789 A | * | 7/1998 | Nakamura |
| 5,893,728 A | | 4/1999 | Hidaka ........................ 438/155 |

FOREIGN PATENT DOCUMENTS

| JP | 06196675 | 7/1994 | ............ H01L/27/12 |
| JP | 07142505 | 6/1995 | ......... H01L/21/331 |
| JP | 08088323 | 4/1996 | ............ H01L/27/04 |
| JP | 09008124 | 1/1997 | ......... H01L/21/762 |
| JP | 09069632 | 3/1997 | ......... H01L/29/786 |

OTHER PUBLICATIONS

Wolf, "Silicon Processing for the VLSI Era, vol. 2—Process Integration," 1990, Lattice Press, vol. 2, p. 178, 180, and 188.*

* cited by examiner

Primary Examiner—Nathan J. Flynn
Assistant Examiner—Kevin Quinto
(74) Attorney, Agent, or Firm—Finnegan, Henderson, Farabow, Garrett & Dunner, L.L.P.

(57) ABSTRACT

A silicon-on-insulator (SOI) device has a reversed stacked capacitor cell and body contact structure. The SOI device includes a semiconductor layer, an isolation film, a first gate, a first source region, a first drain region, a second gate, a second source region, a second drain region, a capacitor, and first, second and third impurity regions. The semiconductor layer includes a gate surface and another surface. The isolation film is of a trench tpye formed in the gate surface of the semiconductor layer. It has a lower surface at a level between the gate surface and the another surface. The isolation film also defines a first device formation region and a second device formation region. The first gate, first source region and first drain region are formed in the first device formation region. The second gate, second source region and second drain region are formed in the second device formation region.

11 Claims, 5 Drawing Sheets

US 6,614,068 B1

SOI DEVICE WITH REVERSED STACKED CAPACITOR CELL AND BODY CONTACT STRUCTURE AND METHOD FOR FABRICATING THE SAME

BACKGROUND OF THE INVENTION

This invention relates to a silicon-on-insulator(SOI) device, and more particularly to a SOI device with a reversed stacked capacitor cell and a body contact structure.

With high performance of semiconductor devices, the semiconductor integration technology using SOI wafers in stead of bulk silicon wafer, which has a stack structure of a base substrate for supporting means, a semiconductor layer for providing an active layer and a buried oxide interleaving therebetween, has been proposed. It is because the devices fabricated in the SOI wafer have advantages of high performance due to low junction capacitance, low voltage driving due to low threshold voltage and decrease in latch-up due to complete device isolation, as compared with those fabricated in the bulk silicon wafer.

On the other hand, because high integration of memory devices such as DRAMs accompanies reduction in cell dimension, it is inevitably necessary to increase height of a capacitor in order to improve capacitance. However, increase in height of a capacitor causes global topology and then increases the height in a metal contact hole of a peripheral region so that it has a difficulty in process and it causes metal interconnection to be open.

So as to solve the above problems, a SOI device having a reversed stacked capacitor(RSC) cell structure is proposed, which forms a capacitor in one surface of a semiconductor layer, reversely turns over the semiconductor layer and then carries out the following process for a bit line and a metal interconnection in another surface of the semiconductor layer.

FIG.1A to FIG.1C are sectional views for illustrating a method for fabricating a SOI device with a RSC cell in the prior art. Referring to FIG.1A, a semiconductor substrate 1 having a cell region CR and a peripheral region PR is prepared. An isolation film 2 of a trench type is formed in one surface of the semiconductor substrate 1. Gates 4 including gate oxides 3 are formed in device formation regions of the cell region CR and the peripheral region PR of the semiconductor substrate 1 which are defined by the isolation film 2. Spacers 5 are formed at the both sides of the gates 4 and first source and drain regions 6a and 7a and second source and drain regions 6b and 7b which are lightly doped drain structures are formed in the device formation regions of the cell region CR and the peripheral region PR at the both sides of the gates 4, respectively. A first insulating layer 8 is formed over the one surface of the semiconductor substrate 1 to cover the gates 4.

Referring to FIG. 1B, a contact hole 9 for storage node is formed in the first insulating layer 8 to expose the first source region 6a which is formed in the cell region CR of the semiconductor substrate 1. A capacitor 10 is formed over the first insulating layer 8 to be contacted with the first source region 6a through the contact hole 9 for storage node. The capacitor 10 includes a storage node 10a, a dielectric film 10b and a plate node 10c. A second insulating layer 11 is formed over the first insulating layer 8 to cover the capacitor 10 and then a base substrate 20 is bonded on the second insulating layer 11.

FIG.1C is a sectional view where the bonded base substrate 20 and the semiconductor substrate 1 are reversely turned over and then the following processes has been carried out. Another surface of the 30 semiconductor substrate 1 is etched to expose the isolation film 2, so that a semiconductor layer 1a is obtained. A third insulating layer 21 is formed over the semiconductor layer 1a and then etched to form a bit line contact hole 22, thereby exposing the first drain region 7a in the cell region CR. A bit line 23 is formed over the third insulating layer 21 to be contacted with the first drain region 7a through the bit line contact hole 22.

A fourth insulating layer 24 is formed over the third insulating layer 21 to cover the bit line 23 and then the third and fourth insulating layers 21 and 24 are etched to form a first and a second metal contacts 25 and 26 thereby exposing the second source and drain regions 6b and 7b in the peripheral region PR, respectively. A metal film is formed over the fourth insulating layer 24 to be buried with the first and the second metal contact holes 25 and 26 and then patterned to form a first and a second metal interconnections 27 and 28 which are contacted with the second source region 6b and the drain region 7b in the peripheral region PR, respectively.

The prior SOI device with a RSC cell structure has low junction capacitance as it is, as like a conventional SOI device and prevents the global topology from occurring in forming a capacitor, so that metal contact holes in the peripheral region are formed with easy and reliability of metal interconnections are assured.

However, because a body of a transistor in the prior SOI device is floated, floating body effect such as parasitic bipolar junction transistor(BJT) effect and kink effect is occurred so that device characteristic is degraded.

SUMMARY OF THE INVENTION

It is an object of the present invention to provide a SOI device for preventing floating body effect from occurring and a method for fabricating the same.

According to an aspect of the present invention, there is provided to a silicon-on-insulator (SOI) device, comprising: a semiconductor layer having a constant thickness, including a cell region and a peripheral region; an isolation film of a trench type formed in one surface of the semiconductor layer at a lower depth than the thickness of the semiconductor layer to define device formation regions in the cell region and the peripheral region; a first and a second gates formed over the one surface of the semiconductor layer in the device formation regions of the cell region and the peripheral region which are defined by the isolation film, respectively; first source and drain regions formed in the device formation region at the both sides of the first gate in the cell region and second source and drain regions formed in the device formation region at the both sides of the second gate in the peripheral region; a first insulating layer formed over the one surface of the semiconductor layer to cover the first and the second gates; a capacitor formed over the first insulating layer to be contacted with the first source region in the cell region; a second insulating layer formed over the first insulating layer to cover the capacitor; a supporting substrate bonded on the second insulating layer; a first impurity region formed in another surface of the semiconductor layer over the first drain region in the cell region to be contacted with the first drain region; a second and a third impurity regions formed in the another surface of the semiconductor over the second source and drain regions in the peripheral region to be contacted with the second source and drain regions, respectively; a third insulating layer formed on the another surface of the semiconductor layer; a first contact hole formed in the third insulating layer to expose the first impurity region; a bit line formed over the third insulating layer to be contacted with the first impurity region through the first contact hole; a fourth insulating layer formed over the third insulating layer to cover the bit line; a second and a third contact holes formed in the third and the fourth insulating layers to respectively expose the second and the third impurity regions; and a first and a second metal interconnections formed over the fourth insulating layer to be connected with the second and the third impurity regions through the second and the third contact holes, respectively.

There is also provided to a method for fabricating a silicon-on-insulator (SOI) device, comprising the steps of preparing a semiconductor substrate having a cell region and a peripheral region; forming an isolation film of a trench type in one surface of the semiconductor substrate to define device formation regions in the cell region and the peripheral region, the isolation film having a constant depth; forming first and second gates in the device formation regions of the cell region and the peripheral region defined by the isolation film, respectively; forming first source and drain regions in the device formation region at the both sides of the first gate in the cell region and the second source and drain regions in the device formation region at the both sides of the second gate in the peripheral region; forming a first insulating layer over the one surface of the semiconductor substrate to cover the first and the second gates; forming a capacitor over the first insulating layer to be contacted with the first source region in the cell region; forming a second insulating layer over the first insulating layer to cover the capacitor; bonding a supporting substrate on the second insulating layer; polishing another surface of the semiconductor substrate to form a semiconductor layer having a thicker thickness than the depth of the isolation film; forming a third insulating layer over the semiconductor layer; etching the third insulating layer to expose a portion of the semiconductor layer over the first drain region in the cell region; forming a first impurity region in an exposed portion of the semiconductor layer to be contacted with the first drain region in the cell region; forming a bit line over the third insulating layer to be electrically contacted with the first impurity region of the cell region; forming a fourth insulating layer over the third insulating layer to cover the bit line; etching the third and fourth insulating layers to expose portions of the semiconductor layer over the second source and drain regions in the peripheral region, respectively; forming a second and a third impurity regions exposed portions of the semiconductor layer to be contacted with the second source and drain regions in the peripheral region, respectively; and forming a first and a second metal interconnections over the fourth insulating layer to be electrically contacted with the second and third impurity regions in the peripheral region, respectively.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 1A:
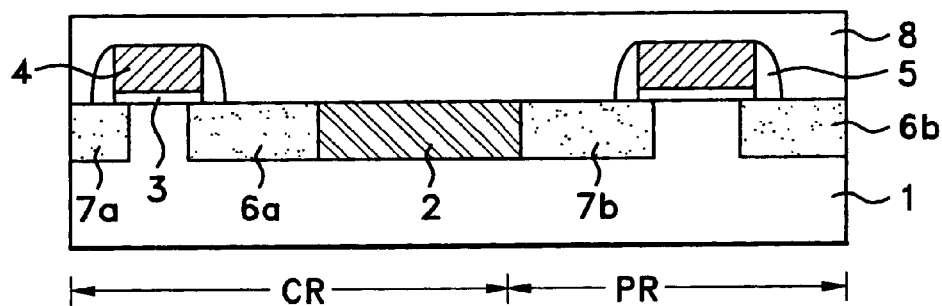
FIG. 1A to FIG. 1C are sectional views illustrating a method for fabricating a SOI device with a RSC cell in the prior art.
Figure 1B:
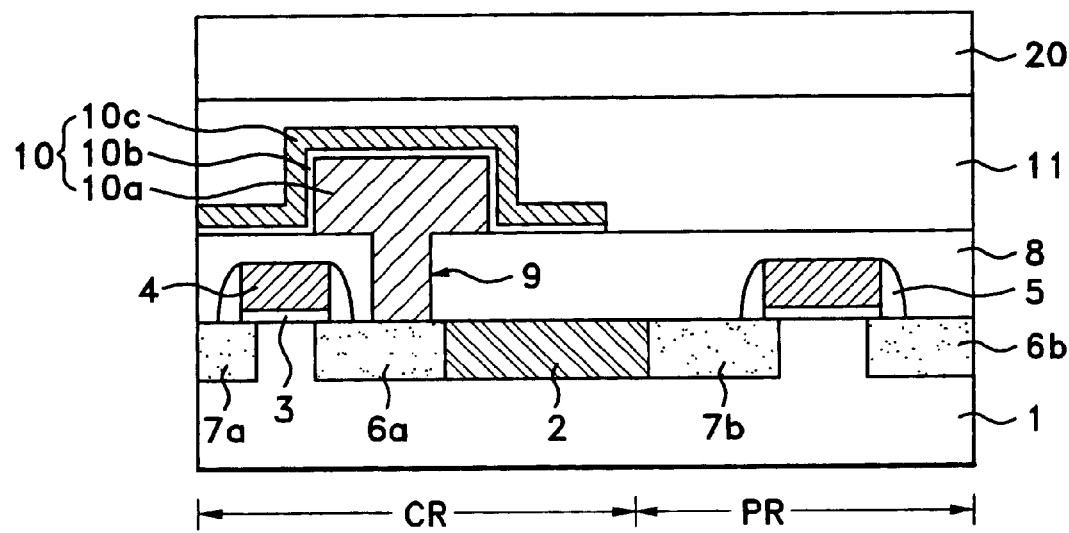
Figure 1C:
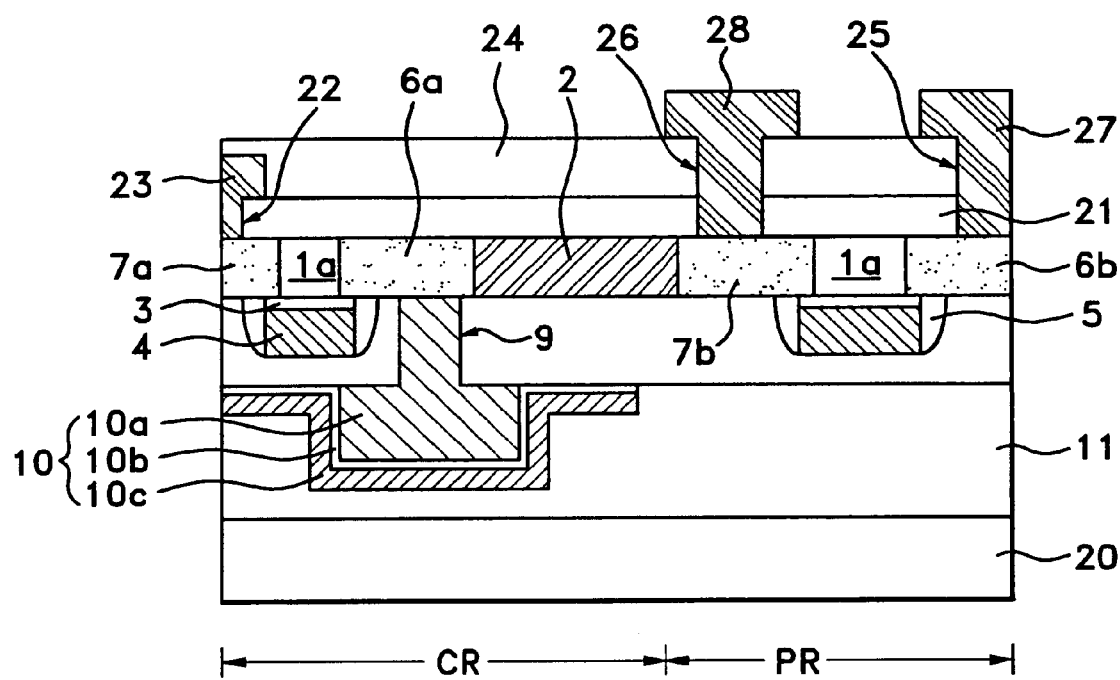
Figure 2A:
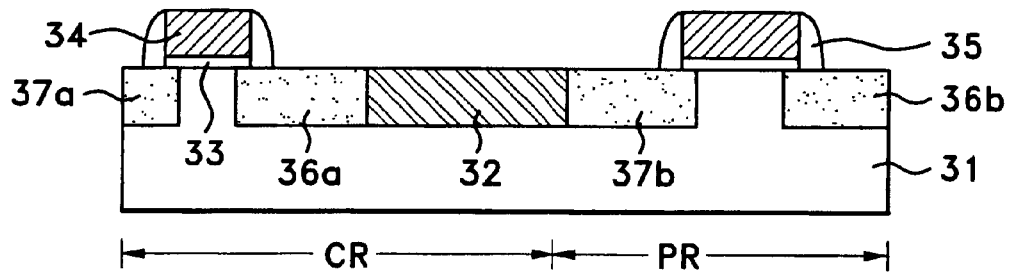
FIG. 2A to FIG. 2E are sectional views illustrating a method for fabricating a SOI device in accordance with one embodiment of the present invention.

FIG. 2A to FIG. 2E are sectional views illustrating a method for fabricating a SOI wafer in accordance with an embodiment of the present invention. Referring to FIG. 2A, a semiconductor substrate 31 having a cell region CR and a peripheral region PR is prepared and an isolation film 32 for defining device formation regions in the cell region CR and the peripheral region PR, is formed in one surface of the semiconductor substrate 31 with a conventional trench isolation process. Herein, the isolation film 32 is formed in a depth which is smaller than a desired thickness of a semiconductor layer which is to be formed in the following process, for example 150 to 250 nm in a depth. Gates 34 including gate oxides 33 is formed over the one surface of the semiconductor substrate 31 in the device formation regions of the cell region CR and the peripheral region PR, which are defined by the isolation film 32. Spacers 35 are formed at the both sides of the gates 34 and first source and drain regions 36a and 37a and second source and drain regions 36b and 37b of lightly doped drain structures are formed in the device formation regions of the cell region CR and the peripheral region PR at the both sides of the gates 34, respectively.

Figure 2B:
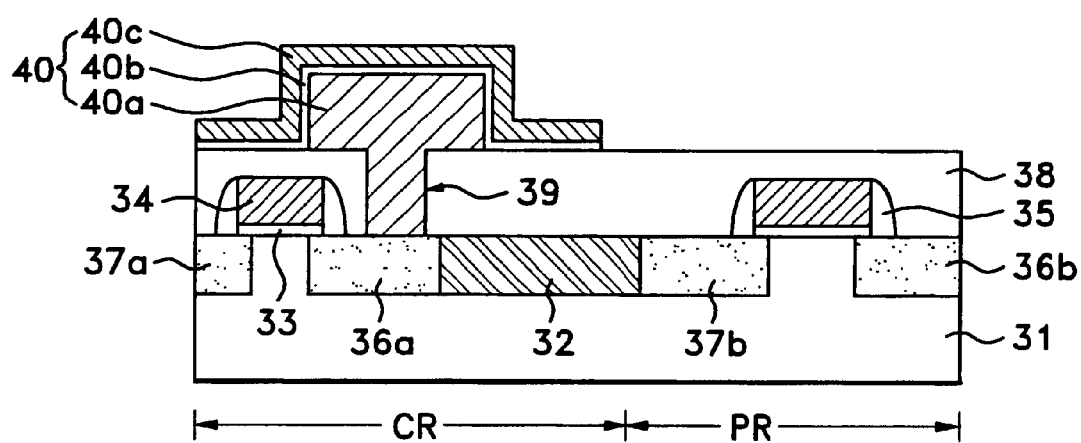

Referring to FIG. 2B, a first insulating layer 38 is formed over the one surface of the semiconductor substrate 31 to cover the gates 34 and then etched by a conventional photolithography to form a contact hole 39 for storage node in the first insulating layer 38, thereby exposing the first source region 36a in the cell region CR of the semiconductor substrate 31. A conduction layer such as a polysilicon, layer is formed over the first insulating layer 38 to be buried with the contact hole 39 for storage node and then patterned to form a storage node 40a which is contacted with the first source region 36a in the cell region CR. A dielectric film 40b and a plate node 40c are formed in turn over the first insulating layer 38 to cover the storage node 40a, thereby forming a capacitor 40 including the storage node 40a, the dielectric film 40b and the plate node 40c.

Figure 2C:
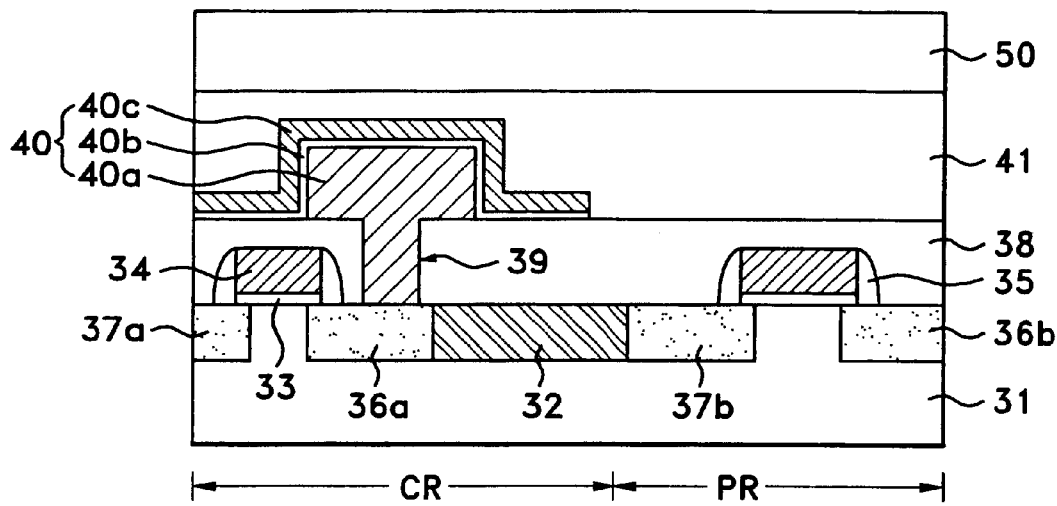

Referring to FIG. 2C, a second insulating layer 41 is formed over the first insulating layer 38 to cover the capacitor 40. A base substrate 50 being comprised of bulk silicon is bonded on the second insulating layer 41.

Figure 2D:
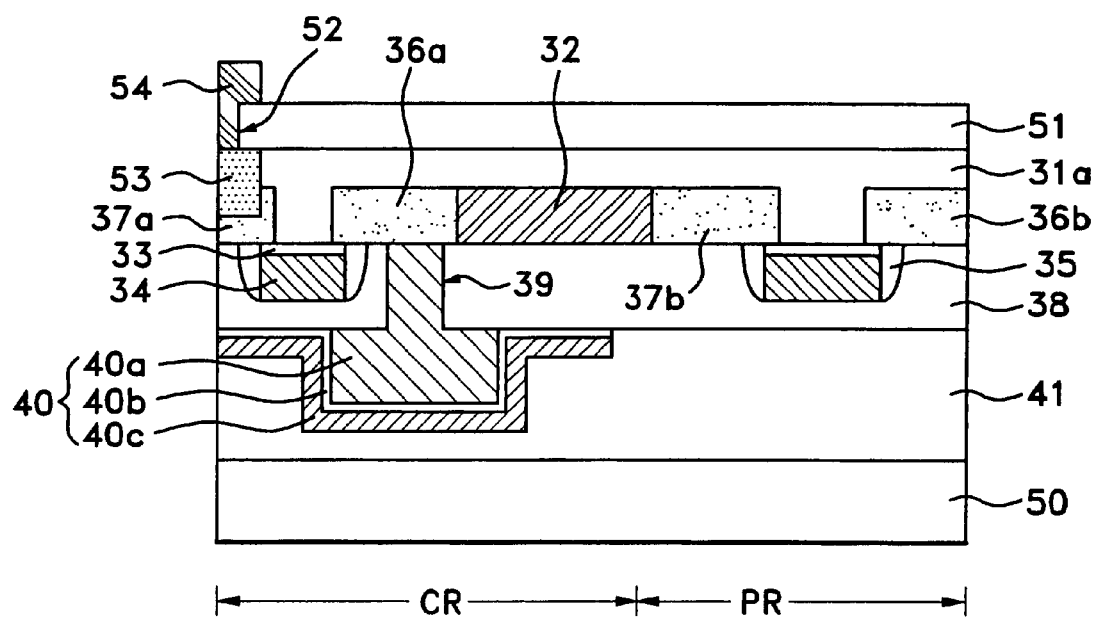

FIG. 2D is a sectional view where the bonded semiconductor substrate and base substrate which are reversely turned over. Another surface of the semiconductor substrate 31 is polished to form a semiconductor layer 31a. At this time, the semiconductor layer 31a over the isolation film 32 remains at a predetermined thickness, for example of 50 to 100 nm. That is, the isolation film 32 is spaced from the surface of the semiconductor layer 31a at a distance of 50 to 100 nm.

Subsequently, a third insulating layer 51 is formed on the semiconductor layer 31a and then etched to form a bit line contact hole 52, thereby exposing a portion of the semiconductor layer 31a over the first drain region 37a in the cell region CR. Impurity ions having the same conductivity as the first drain region 37a, are implanted into the exposed portion of the semiconductor layer 31a through the bit line contact hole 52, so that a first impurity region 53 is formed in the surface of the semiconductor layer 31a to be contacted with the first drain region 37a.

Next, a conduction layer such as a polysilicon layer is formed over the third insulating layer 51 to be buried with the bit line contact hole 52 and then patterned to form a bit line 54. The bit line 54 is electrically connected to the first drain region 37a through the first impurity region 53.

Figure 2E:
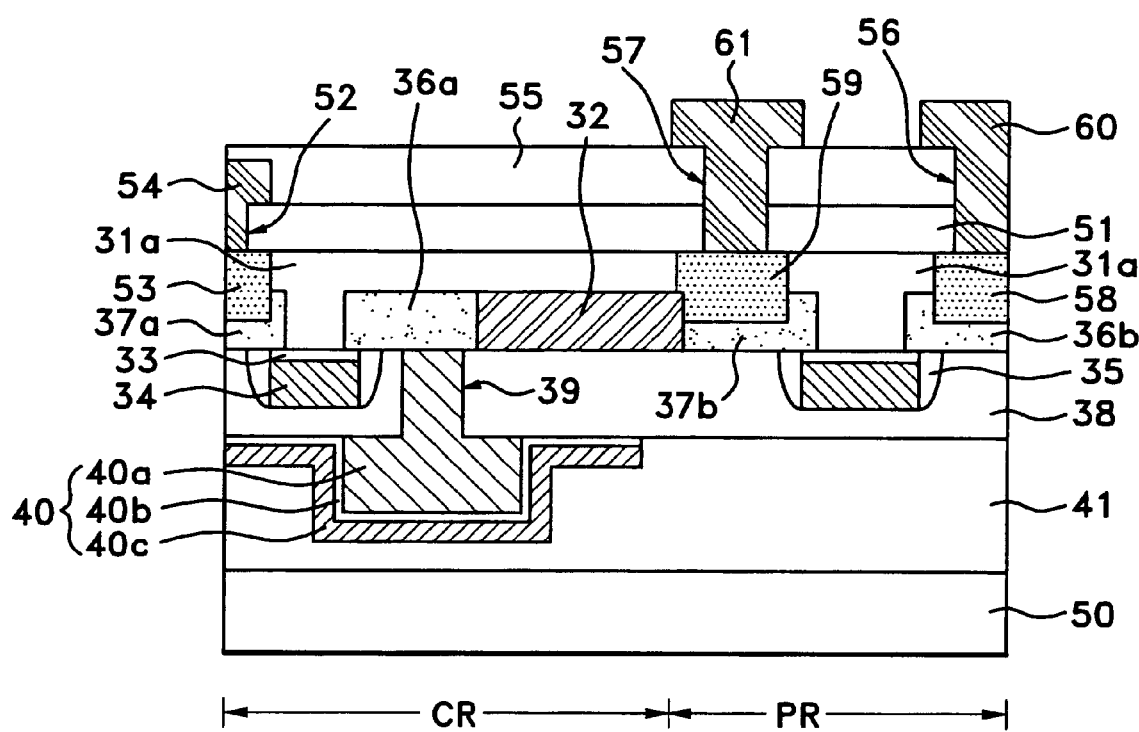

Referring to FIG. 2E, a fourth insulating layer 55 is formed over the third insulating layer 51 to cover the bit line 54. The third and the fourth insulating layers 51 and 55 are etched to form a first and a second metal contact holes 56 and 57, thereby exposing portions of the semiconductor layer 31 over the second source and drain regions 36b and 37b in the peripheral region PR, respectively. Impurity ions having the same conductivity as the second source and drain regions 36b and 37b are implanted into the exposed portions of the semiconductor layer 31a through the first and the second metal contact holes 56 and 57, respectively so that second and third impurity regions 58 and 59 are formed in the semiconductor layer 31a to be contacted with the second source and the drain regions 36b and 37b in the peripheral region PR, respectively. A metal film is formed over the fourth insulating layer 55 to be buried with the first and second metal contact holes 56 and 57 and then patterned to a first and a second metal interconnections 60 and 61 which are electrically connected to the second source and drain regions 36b and 37b in the peripheral region PR through the second and the third impurity regions 58 and 59, respectively.

According to the SOI device with a RSC cell structure of the present invention, the semiconductor silicon layer 31a remains at a thickness of 50 to 100 nm over the isolation film 32 so that it has a body contact structure. Therefore, the SOI device of the present invention prevents the floating body effect from occurring and overcomes the difficulty in process due to the global topology to improve yield and characteristic.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A silicon-on-insulator (SOI) device, comprising:
   a semiconductor layer having a constant thickness and including a cell region and a peripheral region, the semiconductor layer also including a gate surface and another surface parallel to the gate surface;
   an isolation film of a trench type formed in the gate surface of the semiconductor layer, the isolation film having a lower surface at a level between the gate surface and the another surface parallel to the gate surface of the semiconductor layer, the isolation film defining a first device formation region in the cell region and a second device formation region in the peripheral region;
   a first gate and a second gate formed over the semiconductor layer in the first and second device formation regions, respectively;
   a first source region and a first drain region formed in the first device formation region, and a second source region and a second drain region formed in the second device formation region;
   a first insulating layer formed over the first and the second gates;
   a capacitor formed over the first insulating layer, the capacitor having contact with the first source region;
   a second insulating layer formed over the first insulating layer to cover the capacitor;
   a supporting substrate bonded on the second insulating layer;
   a first impurity region formed in the another surface of the semiconductor layer over the first drain region, the first impurity region having contact with the first drain region;
   a second and a third impurity region formed in the another surface of the semiconductor layer over the second source region and the second drain region;
   a third insulating layer formed on the another surface of the semiconductor layer;
   a first contact hole formed in the third insulating layer to expose the first impurity region;
   a bit line formed over the third insulating layer to be contacted with the first impurity region through the first contact hole;
   a fourth insulating layer formed over the third insulating layer to cover the bit line;
   a second hole and a third contact hole formed in the third and the fourth insulating layers to respectively expose the second and the third impurity regions; and
   a first metal interconnection and a second metal interconnection formed over the fourth insulating layer to be connected with the second and the third impurity regions through the second and the third contact holes, respectively.

2. The SOI device as claimed in claim 1, wherein the isolation film has a thickness of 150 to 250 nm.

3. The SOI device as claimed in claim 1, wherein the isolation film is spaced from the another surface of the semiconductor layer at a distance of 50 to 100 nm.

4. The SOI device as claimed in claim 1, wherein the first impurity region has the same conductivity as the first drain region in the cell region.

5. The SOI device as claimed in claim 1, wherein the second and the third impurity regions have the same conductivities as the second source and drain regions in the peripheral regions.

6. A silicon-on-insulator (SOI) device, comprising:
   a semiconductor layer including a gate surface and another surface parallel to the gate surface;
   an isolation film of a trench type formed in the gate surface of the semiconductor layer, the isolation film having a lower surface at a level between the gate surface and the another surface parallel to the gate surface of the semiconductor layer, the isolation film defining a first device formation region and a second device formation region;
   a first gate and a second gate formed over the semiconductor layer in the first and second device formation regions, respectively;
   a first source region and a first drain region formed in the first device formation region, and a second source region and a second drain region formed in the second device formation region;
   a capacitor having contact with the first source region;
   a first impurity region formed in the another surface of the semiconductor layer on the first drain region; and
   a second and a third impurity region formed in the another surface of the semiconductor layer on the second source region and the second drain region, respectively.

7. The SOI device of claim 6, further comprising:
   a first insulating layer formed over the first and the second gate;
   a second insulating layer formed over the first insulating layer to cover the capacitor;

a supporting substrate bonded on the second insulating layer;

a third insulating layer formed on the another surface of the semiconductor layer;

a first contact hole formed in the third insulating layer to expose the first impurity region;

a bit line formed over the third insulating layer and in contact with the first impurity region through the first contact hole;

a fourth insulating layer formed over the third insulating layer to cover the bit line;

a second hole and a third contact hole formed in the third and the fourth insulating layers to respectively expose the second and the third impurity regions; and a first metal interconnection and a second metal interconnection formed over the fourth insulating layer and in contact with the second and the third impurity regions through the second and third contact holes, respectively.

8. The SOI device of claim 6, wherein the isolation film has a thickness of approximately 150 to 250 nm.

9. The SOI device of claim 6, wherein the isolation film is spaced from the another surface of the semiconductor layer at a distance of approximately 50 to 100 nm.

10. The SOI device of claim 6, wherein the first impurity region has the same conductivity as the first drain region.

11. The SOI device of claim 6, wherein the second and third impurity regions have the same conductivities as the second source and drain regions respectively.

* * * * *

UNITED STATES PATENT AND TRADEMARK OFFICE
CERTIFICATE OF CORRECTION

PATENT NO. : 6,614,068 B1
DATED : September 2, 2003
INVENTOR(S) : Myung Jun Chung Page 1 of 1

It is certified that error appears in the above-identified patent and that said Letters Patent is hereby corrected as shown below:

<u>Title page</u>,
Item [57], ABSTRACT,
Line 8, "tpye" should read -- type --.

<u>Column 6</u>,
Line 7, "drain region;" should read -- drain region, respectively, the second impurity region having contact with the second source region and the third impurity region having contact with the second drain region; --.

<u>Column 8</u>,
Line 13, "regions respectively." should read -- regions, respectively. --.

Signed and Sealed this

Sixteenth Day of March, 2004

JON W. DUDAS
*Acting Director of the United States Patent and Trademark Office*